US012757516B2

(12) United States Patent
Liu et al.

(10) Patent No.: US 12,757,516 B2
(45) Date of Patent: Oct. 6, 2026

(54) METHOD FOR PREPARING SOLAR CELL

(71) Applicants: TRINA SOLAR CO., LTD., Changzhou (CN); TRINA SOLAR (SUQIAN) PHOTOELECTRIC CO., LTD., Suqian (CN)

(72) Inventors: Chengfa Liu, Changzhou (CN); Xiaopeng Wu, Changzhou (CN); Yaqian Zhang, Changzhou (CN); Yang Zou, Changzhou (CN); Yugang Lu, Changzhou (CN); Shuai Zhang, Changzhou (CN); Hong Chen, Changzhou (CN); Daming Chen, Changzhou (CN); Yifeng Chen, Changzhou (CN)

(73) Assignees: TRINA SOLAR CO., LTD., Jiangsu (CN); TRINA SOLAR (SUQIAN) PHOTOELECTRIC CO., LTD., Jiangsu (CN)

( * ) Notice: Subject to any disclaimer, the term of this patent is extended or adjusted under 35 U.S.C. 154(b) by 26 days.

(21) Appl. No.: 18/754,963

(22) Filed: Jun. 26, 2024

(65) Prior Publication Data

US 2024/0347655 A1 Oct. 17, 2024

Related U.S. Application Data

(63) Continuation of application No. 18/387,556, filed on Nov. 7, 2023, now Pat. No. 12,062,728.

(30) Foreign Application Priority Data

Feb. 7, 2023 (CN) ......................... 202310072596.5

(51) Int. Cl.

| | |
|---|---|
| ***H10F 77/1223*** | (2025.01) |
| ***H10F 71/00*** | (2025.01) |
| ***H10F 77/30*** | (2025.01) |

(52) U.S. Cl.

CPC ......... *H10F 71/128* (2025.01); *H10F 71/121* (2025.01); *H10F 71/129* (2025.01);

(Continued)

(58) Field of Classification Search

CPC .... H10F 71/121; H10F 71/128; H10F 71/129; H10F 71/131; H10F 71/134

See application file for complete search history.

(56) References Cited

U.S. PATENT DOCUMENTS

| | | | |
|---|---|---|---|
| 2008/0092944 | A1 | 4/2008 | Rubin |
| 2014/0299187 | A1 | 10/2014 | Chang |

(Continued)

FOREIGN PATENT DOCUMENTS

| | | | |
|---|---|---|---|
| CN | 110299422 | A | 10/2019 |
| CN | 110600558 | A | 12/2019 |

(Continued)

OTHER PUBLICATIONS

Examination report dated Oct. 1, 2024 received in Australian Patent Application No. 2024216432.

(Continued)

*Primary Examiner* — Lindsey A Buck

(74) *Attorney, Agent, or Firm* — Scully, Scott, Murphy & Presser, P.C.

(57) ABSTRACT

A method for preparing a solar cell is provided. The method includes providing a N-type silicon substrate; depositing a tunnel passivation structure on the first surface of the N-type silicon substrate, and then depositing a mask layer on the tunnel passivation structure; cleaning the second surface of the N-type silicon substrate; performing boron diffusion treatment on the cleaned second surface of the N-type silicon substrate and annealing treatment on the tunnel passivation structure in the same environment, so that a first emitter layer is formed on the second surface of the N-type (Continued)

silicon substrate and the tunnel passivation structure is crystallized; performing laser patterning treatment on the first emitter layer to form a second emitter region; depositing a passivation and anti-reflection film; and forming a first electrode and a second electrode.

14 Claims, 3 Drawing Sheets

(52) U.S. Cl.
CPC ......... *H10F 71/131* (2025.01); *H10F 71/134* (2025.01); *H10F 77/1223* (2025.01); *H10F 77/315* (2025.01)

(56) References Cited

U.S. PATENT DOCUMENTS

| | | | | |
|---|---|---|---|---|
| 2015/0372183 | A1 | 12/2015 | Jin et al. | |
| 2017/0005218 | A1* | 1/2017 | Chang ................... | H10F 10/165 |
| 2022/0115545 | A1 | 4/2022 | Huang et al. | |

FOREIGN PATENT DOCUMENTS

| | | | |
|---|---|---|---|
| CN | 111106188 | A | 5/2020 |
| CN | 111952409 | A | 11/2020 |
| CN | 112582485 | A | 3/2021 |
| CN | 112670353 | A | 4/2021 |
| CN | 113809201 | A | 12/2021 |
| CN | 115036391 | A | 9/2022 |
| CN | 115440839 | A | 12/2022 |
| CN | 115642202 | A | 1/2023 |
| JP | 2012151265 | A | 8/2012 |
| JP | 2013222961 | A | 10/2013 |
| JP | 2013236083 | A | 11/2013 |
| JP | 2014229851 | A | 12/2014 |
| JP | 2017135386 | A | 8/2017 |
| JP | 2020077851 | A | 5/2020 |
| JP | 2022128577 | A | 9/2022 |
| WO | 2011155199 | A1 | 12/2011 |
| WO | 2016080348 | A1 | 5/2016 |

OTHER PUBLICATIONS

Extended European search report dated Apr. 25, 2024 received in European Patent Application No. 23206586.2.
Notice of Reasons for Refusal dated Mar. 6, 2025 received in Japanese Patent Application No. 2024-075117.
Notice of Grant of Patent Right dated Apr. 24, 2023 received in Chinese Patent Application No. CN 202310072596.5.
Second Office Action dated Apr. 13, 2023 received in Chinese Patent Application No. CN 202310072596.5.
Examination Report No. 1 dated Nov. 23, 2023 received in Australian Patent Application No. AU 2023258373.
First Office Action dated Mar. 22, 2023 received in Chinese Patent Application No. CN 202310072596.5.
Office Action dated Jan. 18, 2024 received in U.S. Appl. No. 18/387,556.
Examination Report No. 2 dated Feb. 16, 2024 received in Australian Patent Application No. AU 2023258373.
Office Action dated Jan. 16, 2024 received in Japanese Patent Application No. JP 2023-185271.
Notice of Allowance dated Apr. 23, 2024 received in U.S. Appl. No. 18/387,556.

* cited by examiner

METHOD FOR PREPARING SOLAR CELL

FIELD

This application relates to the field of solar cells.

BACKGROUND

TOPCon (Tunnel Oxide Passivated Contact) solar cell is a solar cell that uses an ultra-thin oxide layer as a passivation layer structure. N-type TOPCon cells have been in large-scale mass production in 2022, and the scale under construction has exceeded 40GW, and N-type TOPCon cells will gradually replace p-type cells to dominate the market. At present, N-type TOPCon cells usually use boron doping to form the emitter structure. The emitter usually has a uniform junction, and therefore its metal contact recombination, short-wave response and recombination rate are often not optimal. In order to achieve lower metal contact recombination, the junction depth of boron doping generally needs to be above 0.7 μm. However, boron atoms are difficult to dope, and it requires a temperature of more than 970 degrees and more than 3 hours to reach a junction depth of more than 0.7 μm. As a result, the power consumption and equipment loss in cell manufacturing are high, and long-time high temperatures require higher quality silicon wafers, which greatly increase levelized cost of energy of solar cells. The electrochemical capacitance-voltage (ECV) doping concentration-depth curve (ECV doping curve) of the boron emitter manufactured by this method is shown in FIG. 3 (the conventional boron emitter in FIG. 3 represents the ECV doping curve of the boron emitter). There is a need to further optimize the structure of N-type TOPCon cells in this field.

SUMMARY

The present application provides a solar cell, comprising:

- an N-type silicon substrate having a first surface and a second surface,
- a tunnel passivation structure and a first passivation and anti-reflection film formed on the first surface,
- a boron-doped emitter structure layer formed on the second surface, wherein the emitter structure layer includes a first emitter layer and a second emitter region, wherein the junction depth of the first emitter layer is smaller than that of the second emitter region, and the total boron doping amount of the first emitter layer is less than that of the second emitter region,
- a second passivation and anti-reflection film formed on the emitter structure layer,
- a first electrode configured to be in electrical contact with the second emitter region,
- a second electrode configured to be in electrical contact with the tunnel passivation structure.

The solar cell of the present application has a selective emitter structure. The metal contact region has a large junction depth to meet the metallization requirements. The region outside the metal contact region has a small junction depth to improve the optical response. At the same time, the total boron doping amount of the first emitter layer is less than that of the second emitter region, which not only meets the photoelectric conversion performance of the solar cell, but also greatly shorten the high-temperature time of the boron diffusion process during the preparation process, therefore reduces the manufacturing cost of the solar cell.

In one embodiment, the tunnel passivation structure includes a tunnel oxide layer and a passivation contact material layer, wherein the tunnel oxide layer is disposed between the N-type silicon substrate and the passivation contact material layer.

In one embodiment, the material of the passivation contact material layer is selected from one or more of doped amorphous silicon, doped polysilicon, and silicon carbide.

In one embodiment, the second electrode is configured to be in electrical contact with the passivation contact material layer.

In one embodiment, the junction depth of the first emitter layer is less than or equal to 0.7 μm.

In one embodiment, the junction depth of the second emitter region is greater than or equal to 0.8 μm.

In one embodiment, the highest boron doping concentration of the second emitter region is less than or equal to $2\times10^{19}$ atm/cm$^3$.

In one embodiment, the highest point in the ECV doping curve of the first emitter layer is at an internal position at a depth of 0.05-0.5 μm from the surface of the first emitter layer.

In one embodiment, within the range of a depth of 0.02-0.6 μm from the surface of the first emitter layer in the ECV doping curve of the first emitter layer, the difference between the highest boron doping concentration and the lowest boron doping concentration in the first emitter layer is greater than 1 orders of magnitude.

In one embodiment, within the range of 0.05-0.7 μm from the surface of the second emitter region in the ECV doping curve of the second emitter region, the difference between the highest boron doping concentration and the lowest boron doping concentration in the second emitter region is less than 1 order of magnitude.

In one embodiment, the sheet resistance of the first emitter layer is greater than that of the second emitter region.

In one embodiment, the sheet resistance of the first emitter layer is greater than or equal to 150 ohm/sq, and the sheet resistance of the second emitter region is less than or equal to 150 ohm/sq.

In one embodiment, the width of the first electrode is smaller than that of the second emitter region.

In one embodiment, the material of the passivation and anti-reflection film is selected from combinations of one or more of aluminum oxide, silicon oxide, silicon nitride, and silicon oxynitride.

DETAILED DESCRIPTION OF EXEMPLARY EMBODIMENTS

Figure 1:
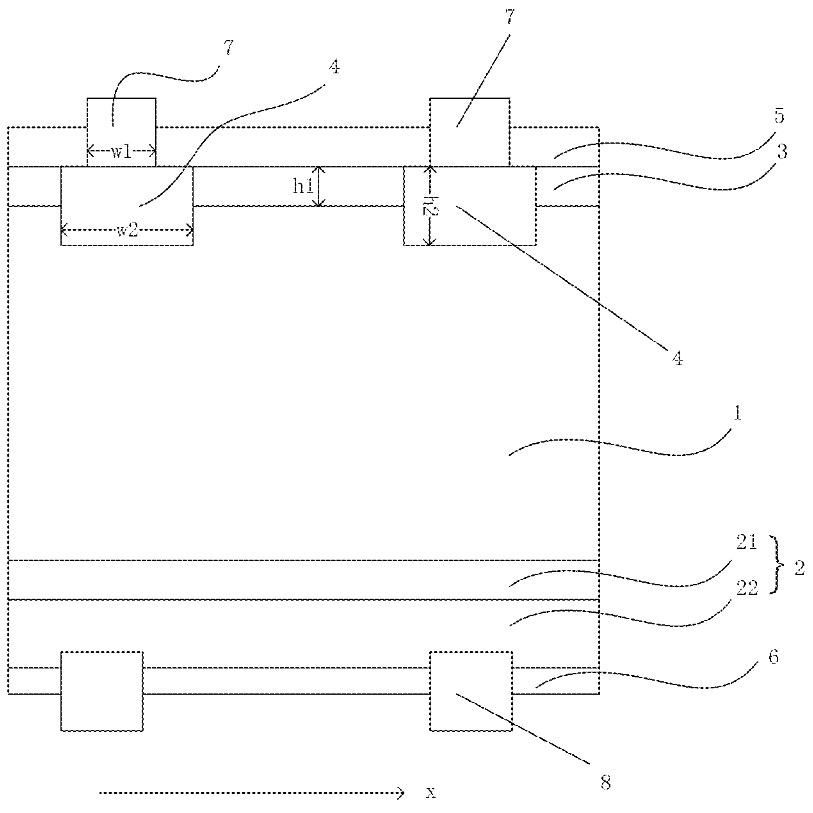
FIG. 1 shows a schematic structural diagram of a solar cell of the present disclosure.

The present application will be further described in detail below in conjunction with the drawings and examples. Through these descriptions, the features and advantages of the present application will become clear.

The word “exemplary” as used herein means “serving as an example, example, or illustrative.” Any embodiment described herein as “exemplary” is not necessarily to be construed as superior to other embodiments. Although various aspects of the embodiments are illustrated in the drawings, the drawings are not necessarily drawn to scale unless otherwise indicated.

In addition, the technical features involved in different embodiments of the present application described below can be combined with each other as long as they do not conflict with each other.

As shown in FGI. 1, the present application provides a solar cell, comprising:

an N-type silicon substrate 1 having a first surface and a second surface, a tunnel passivation structure 2 and a first passivation and anti-reflection film 6 formed on the first surface, a boron-doped emitter structure layer formed on the second surface, wherein the emitter structure layer includes a first emitter layer 3 and a second emitter region 4, wherein the junction depth of the first emitter layer 3 is smaller than that of the second emitter region 4, the highest boron doping concentration of the first emitter layer is greater than that of the second emitter region, and the total boron doping amount of the first emitter layer is less than that of the second emitter region, a second passivation and anti-reflection film 5 formed on the emitter structure layer, a first electrode 7 configured to be in electrical contact with the second emitter region 4, a second electrode 8 configured to be in electrical contact with the tunnel passivation structure 2.

In this application, the front surface refers to the surface where sunlight enters, and the back surface refers to the surface opposite to the surface where sunlight enters. In FIG. 1, the upper side surface of the N-type silicon substrate 1 is the front surface (second surface), and the lower side surface is the back surface (first surface).

Figure 2:
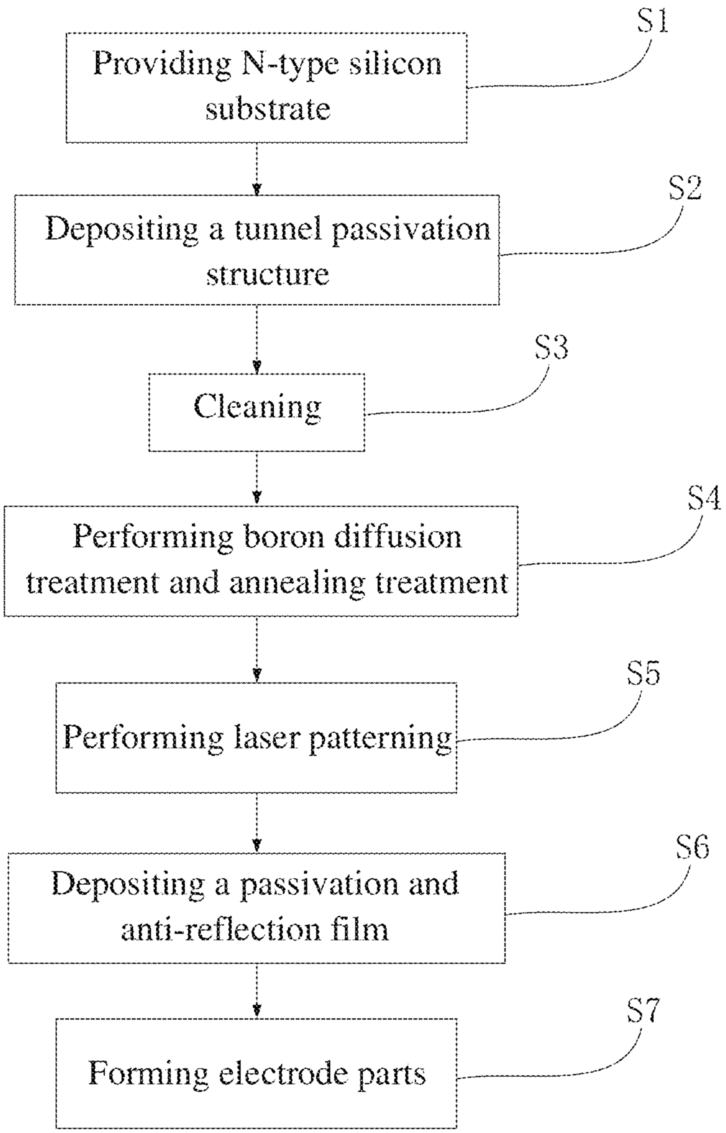
FIG. 2 shows a flow chart of a method for preparing solar cells of the present disclosure.

The structure of the solar cell is described below in conjunction with the preparation process. As shown in FIG. 2, the solar cell can be prepared as follows.

S1 Providing N-type silicon substrate;

S2 Depositing a tunnel passivation structure on the first surface of the N-type silicon substrate, and then depositing a mask layer on the tunnel passivation structure;

S3 Cleaning the second surface of the N-type silicon substrate'

S4 Performing boron diffusion treatment on the cleaned second surface of the N-type silicon substrate and annealing treatment on the tunnel passivation structure in the same environment, so that a first emitter layer is formed on the second surface of the N-type silicon substrate and the tunnel passivation structure is crystallized;

S5 Performing laser patterning on the first emitter layer to form a second emitter region;

S6 Depositing a passivation and anti-reflection film; and

S7 Forming a first electrode and a second electrode, wherein the first electrode is configured to be in electrical contact with the second emitter region, and the second electrode is configured to be in electrical contact with the tunnel passivation structure.

Before preparation, the N-type silicon substrate can be cleaned and polished to facilitate subsequent processes.

After that, as shown in FIG. 1, a tunnel passivation structure 2 is deposited on the first surface (back surface) of the N-type silicon substrate 1. The tunnel passivation structure may be various tunnel passivation structures that can be used in TOPCon cells. For example, it can include a tunnel oxide layer 21 and a passivation contact material layer 22, wherein the tunnel oxide layer 21 is disposed between the N-type silicon substrate 1 and the passivation contact material layer 22. In one embodiment, the tunnel oxide layer may be made of silicon oxide or other materials. In one embodiment, the material of the passivation contact material layer is selected from one or more of doped amorphous silicon, doped polysilicon, and silicon carbide material SiCx, such as phosphorus-doped polysilicon layer and silicon carbide material.

Afterwards, a cleaning step is performed on the second surface (front surface) of the N-type silicon substrate to remove unnecessary wrap-around material layers produced on the front surface, such as polysilicon layers. A texturing step can also be performed after cleaning, whereby a textured surface can be formed to increase surface area, reduce surface reflectivity, remove impurities, and so on.

After that, the cleaned second surface of the N-type silicon substrate is subjected to boron diffusion treatment and the tunnel passivation structure is annealed in the same environment, so that a first emitter layer is formed on the second surface of the N-type silicon substrate and the tunnel passivation structure is crystallized. Boron is diffused on the second surface (front surface) of the N-type silicon substrate 1 to form a p-type silicon layer, that is, the first emitter layer 3. When being processed in the same environment, in addition to boron diffusion on the second surface (front surface) of the N-type silicon substrate to form a p-type silicon layer (first emitter layer 3), the pre-formed tunnel passivation structure 2 is also simultaneously subjected to an annealing treatment, so that crystallization of the materials in the passivation contact material layer and redistribution of doping elements can be completed during the high-temperature diffusion process of boron, which can improve the passivation capability of the passivation contact structure. Therefore, there is no need to perform a separate annealing treatment step on the tunnel passivation structure, thereby avoiding the adverse effects of the high temperature of the annealing treatment on the silicon wafer and the layers formed thereon. In one embodiment, the boron source used in the boron diffusion treatment can be $BCl_3$, $BBr_3$, etc. In this application, the temperature of the boron diffusion treatment is low and the time is short, and the junction depth of the formed p-type silicon layer (first emitter layer) is relatively small. The junction depth of the first emitter layer 3 can be less than or equal to 0.7 μm, which can improve optical response. In one embodiment, the temperature of the same environment is 300-970° C., and the treatment time at 800-970° C. is less than 3 hours. In one embodiment, the sheet resistance of the first emitter layer is greater than or equal to 150 ohm/sq.

In one embodiment, the junction depth of the first emitter layer 3 may be less than or equal to 0.7 μm, thereby improving the optical response. FIG. 1 shows the junction depth h1 of the first emitter layer, which is equivalent to the thickness of the first emitter layer, which is the distance from the surface to where the first emitter layer is present.

Afterwards, laser patterning is performed on the first emitter layer 3 to form a second emitter region 4. The conditions for laser patterning are: using one or two or more wavelengths of laser such as ultraviolet, green or infrared, the pulse width is nanoseconds, picoseconds or femtoseconds, and the average power is 5-200 W, for example, green nanosecond laser with a wavelength of 532 nm and power of 30 W can be used. As shown in FIG. 1, through laser patterning, boron doping can be promoted to form a second emitter region with different junction depth, doping concentration and sheet resistance from the first emitter layer. In this application, the junction depth h1 of the first emitter layer is smaller than the junction depth h2 of the second emitter region. FIG. 1 shows the junction depth h2 of the second emitter region, which is equivalent to the thickness of the second emitter region, which is the distance from the surface to where the second emitter is present. In one embodiment, the junction depth h2 of the second emitter region is greater than or equal to 0.8 μm. However, the junction depth h2 of the second emitter region generally does not exceed 5 μm. As described later, the second emitter region is in electrical contact with the first electrode 7, and the above junction depth h2 can meet the metallization requirements. The first emitter layer 3 and the second emitter region 4 together form an emitter structure layer.

For the first emitter layer, the highest point in the ECV doping concentration-depth curve (ECV doping curve) is not on the surface of the silicon wafer, but at an internal position at a depth of about 0.02-0.5 μm from the surface of the first emitter layer. Moreover, the change amplitude of the doping curve of the first emitter layer is relatively large, and the doping concentration changes greatly in the depth range of 0.02-0.6 μm, and the difference between the highest boron doping concentration and the lowest doping concentration is greater than 1 order of magnitude. For example, the boron doping concentration in the first emitter layer is $2\times10^{19}$ to $1\times10^{18}$ atm/cm$^3$, or $3\times10^{19}$ to $5\times10^{17}$ atm/cm$^3$, etc. The steep diffusion junction of the first emitter layer can be achieved using a shorter boron diffusion process time, therefore reducing manufacturing costs.

For the second emitter region, the ECV doping concentration-depth curve (ECV doping curve) of the second emitter region is flatter, the doping concentration does not change much in the depth range of 0.05-0.7 μm, and the difference between the highest boron doping concentration and the lowest boron doping concentration is less than 1 order of magnitude. For example, the boron doping concentration in the second emitter region is $1\times10^{19}$-$1\times10^{18}$ atm/cm$^3$, $5\times101^{8}$-$5\times10^{19}$ atm/cm$^3$, or $1\times10^{19}$-$1\times10^{20}$ atm/cm$^3$. The flatter doped junction in the second emitter region is more conducive to forming a good metal contact and reducing the contact resistivity. It can also reduce the recombination current density in the metal region and improve the photoelectric conversion efficiency of the solar cell.

In one embodiment, the sheet resistance of the first emitter layer is greater than the sheet resistance of the second emitter region. In one implementation, the sheet resistance of the first emitter layer is greater than or equal to 150 ohm/sq, and the sheet resistance of the second emitter region is less than or equal to 150 ohm/sq.

Afterwards, the silicon wafer surface is cleaned. This cleaning step can clean the mask layer on the tunnel passivation structure on the back surface and the oxide layer on the front surface. The cleaning step may be implemented by alkali washing and/or acid washing. For example, alkali washing may use potassium hydroxide solution, sodium hydroxide solution, etc. as detergents, and acid washing may use HF solution, HCl solution, etc. as detergents.

Afterwards, passivation and anti-reflection films are deposited on both surfaces of the silicon wafer. The method of depositing the passivation and anti-reflection films can use various methods known in the art. The material of the passivation and anti-reflection films can be various commonly used passivation and anti-reflection film materials such as combination of one or more of aluminum oxide, silicon oxide, silicon nitride, and silicon oxynitride. The passivation and anti-reflection film can be composed of a single layer of material, or a multi-layer structure composed of multiple layers of materials. As shown in FIG. 1, the second passivation and anti-reflection film 5 is located on the front surface, and the first passivation and anti-reflection film 6 is located on the back surface.

After that, metal electrode parts are deposited. As shown in FIG. 1, the metal electrode parts include a first electrode 7 and a second electrode 8. The first electrode 7 is located on the front surface and is configured to be in electrical contact with the second emitter region 4. The second electrode 8 is located on the back surface and is configured to be in electrical contact with the tunnel passivation structure 2, in particular with the passivation contact material layer 22. Depositing metal electrodes can be done by conventional means such as screen printing.

In one embodiment, as shown in FIG. 1, the width of the first electrode 7 is smaller than the width of the second emitter region 4. FIG. 1 shows the width w1 of the first electrode 7 and the width w2 of the second emitter region 4, which are the respective edge spacings of the first electrode 7 and the second emitter region 4 in the x direction. This arrangement has the following advantages: the first electrode region can completely cover the second emitter region, and heavy doping effectively reduces metal recombination under the first electrode region, reduces recombination current density, and increases the open circuit voltage of the cells.

EXAMPLE 1

Wet chemical cleaning is performed on n-type silicon wafers to remove surface damage and impurities, and alkali solution is used to polish the surface to form a surface with higher flatness and a reflectivity greater than 30%, which is more suitable for achieving better passivation effect of the passivation contact structure of the back surface.

A tunnel silicon oxide layer and a doped polysilicon layer are deposited on the back surface of the silicon wafer through PECVD method. The thickness of the tunnel silicon oxide layer is 0.9-2 nm and the thickness of the doped polysilicon layer is 75-150 nm. Then, a silicon oxide layer mask is further deposited on the outer layer, with thickness of 10-50 nm.

Wet chemical cleaning is used to remove the wrap-around polysilicon layer on the front surface, and then the front surface is subjected to alkali texturing to form a pyramid structure on the front surface of the silicon wafer, while the back surface maintains the original structure under the protection of a mask.

The silicon wafer is placed in a tubular diffusion furnace tube, and $BCl_3$ and oxygen gas are introduced at a temperature above 800° C. Reaction occurs on the surface of the silicon wafer and boron atoms are formed and then diffused into the interior of the silicon wafer to form the first emitter, and a silicon oxide layer containing rich boron atoms, that is, borosilicate glass BSG is formed on the surface. The conditions for boron diffusion are: in the deposition step, the $BCl_3$ flow rate is 300 sccm, the oxygen gas flow rate is 200 sccm, the temperature is 850° C., and the time is 15 minutes. Then in the process of forming junction, the temperature increases and the temperature is 930° C., time is 30 min. The sheet resistance of the first emitter is 150-250 ohm/sq, the junction depth of the first emitter is 0.5 μm, and the thickness of BSG is 10-150 nm. At the same time, under the high temperature and time of boron diffusion, the crystallization of the doped polysilicon layer on the back surface and the redistribution of doping elements are completed, which improves the passivation capability of the passivation contact structure.

Patterning is implemented to the borosilicate glass of the front surface using long pulse laser or short pulse but high overlap rate laser. The laser power is 30 W, the spot width is 60-200 μm, and the shape of the spot is circular, elliptical or rectangular. After laser treatment, the sheet resistance dropped to less than 150 ohm/sq, the junction depth of the diffused second emitter became greater than or equal to 0.7 μm, and the surface doping concentration dropped to $1\times10^{19}$ $cm^{-3}$.

Wet chemical cleaning is performed on the surface of the silicon wafer to remove the BSG layer on the front surface, the laser damage layer, and the mask on the back surface.

ALD is used to deposit aluminum oxide with a thickness of 2-20 nm on the front surface of the silicon wafer. Then PECVD is used to deposit combinations of one or more of silicon oxynitride and silicon oxide with a thickness of 50-200 nm on the front surface, thus forming the second passivation and anti-reflection film.

On the back surface of the silicon wafer, PECVD is used to deposit the combinations of one or more of silicon oxynitride and silicon oxide with a thickness of 30-200 nm, thereby forming the first passivation and anti-reflection film.

On the back surface, screen printing is used to print finger and busbar electrodes, and on the front surface, screen printing is used to print finger electrodes above the second emitter in the laser processing region. The width of the electrodes on the front surface is less than 50 μm. Afterwards, it is sintered at high temperature to form ohmic contact between the metal electrodes and the emitter.

Figure 3:
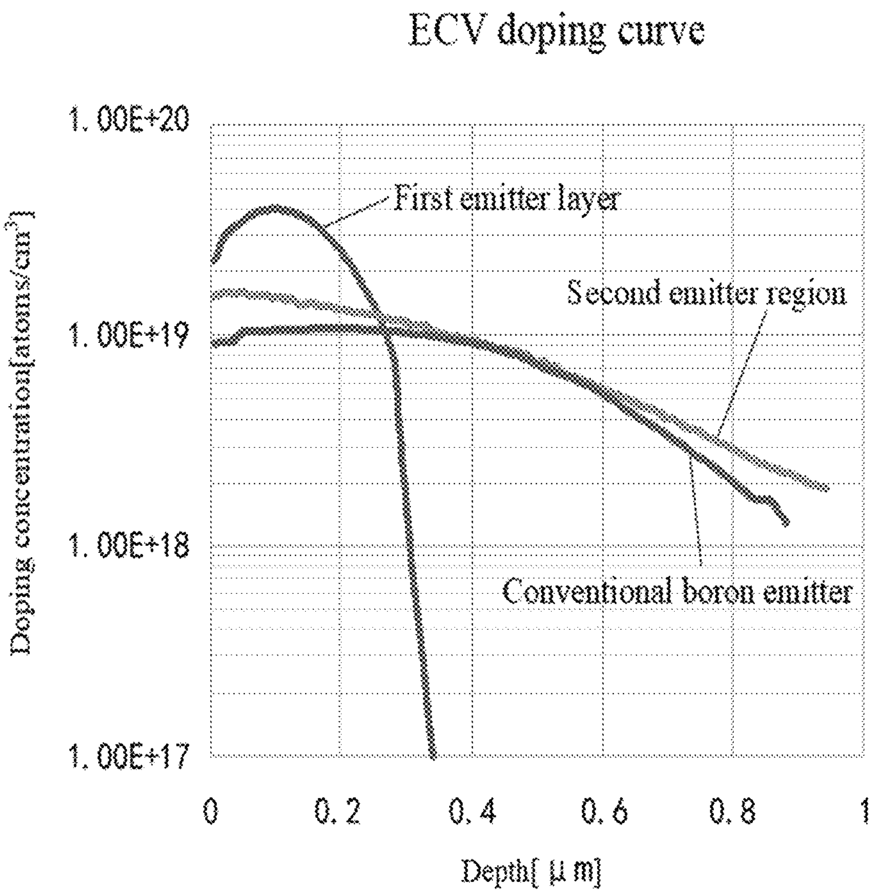
FIG. 3 shows the ECV doping curves in the first emitter layer and the second emitter region of the solar cell of Example 1 and the ECV doping concentration-depth curve of a conventional boron emitter.

FIG. 3 also shows the ECV doping curves in the first emitter layer and the second emitter region of the solar cell obtained in Example 1 (in FIG. 3, the first emitter layer represents the ECV doping curve of the first emitter layer, the second emitter region represents the ECV doping curve of the second emitter region), showing that the first emitter layer has a steep diffusion junction type, while the second emitter region has a flatter doping junction type.

Compared with the solar cell prepared in Example 1 of CN110299422A, the depth of the first emitter of the solar cell obtained in Example 1 of the present disclosure is smaller, with junction depth less than 0.7 μm, and the short-wave response of the cell is improved, and the short-circuit current density is higher, increased from 40.3 $mA/cm^2$ to 40.6 $mA/cm^2$.

Compared with the solar cell prepared in Example 1 of CN110299422A, the depth of the second emitter of the solar cell obtained in Example 1 of the present disclosure after laser doping is deeper, greater than 0.7 μm, and the electrode contact resistance is lower, falling from 1.5 $ohm/cm^2$ to 0.9 $ohm/cm^2$.

In the description of this application, it should be noted that the terms "upper", "lower", "inner", "outer", "front", "back", "left", "right", etc. indicate the orientation or position that are based on the working state of the present application. It is only for the convenience of describing the present application and simplifying the description. It does not indicate or imply that the device or component referred to must have a specific orientation, be constructed and operated in a specific orientation. Therefore, it cannot be construed as a limitation of this application.

The present application has been described above with reference to preferred embodiments, but these embodiments are only exemplary and serve an illustrative purpose. On this basis, various substitutions and improvements can be made to the present application, which all fall within the protection scope of the present application.

The invention claimed is:

1. A method for preparing a solar cell, comprising:

providing an N-type silicon substrate;

depositing a pre-formed tunnel passivation structure on a back surface of the N-type silicon substrate, and then depositing a mask layer on the pre-formed tunnel passivation structure;

cleaning a front surface of the N-type silicon substrate;

performing boron diffusion treatment on the cleaned front surface of the N-type silicon substrate and annealing treatment on the pre-formed tunnel passivation structure in the same environment, so that a first emitter layer is formed on the front surface of the N-type silicon substrate and the pre-formed tunnel passivation structure is crystallized to obtain a tunnel passivation structure;

performing laser patterning treatment on the first emitter layer to form a second emitter region, and then cleaning the N-type silicon substrate surface in order to clean the mask layer on the tunnel passivation structure on the back surface;

depositing a passivation and anti-reflection film; and forming a first electrode and a second electrode, wherein the first electrode is configured to be in electrical contact with the second emitter region, and the second electrode is configured to be in electrical contact with the tunnel passivation structure.

2. The method according to claim 1, wherein the pre-formed tunnel passivation structure includes a tunnel oxide layer and a passivation contact material layer, wherein the tunnel oxide layer is disposed between the N-type silicon substrate and the passivation contact material layer, and wherein the pre-formed tunnel passivation structure is subjected to the annealing treatment, so that crystallization of the materials in the passivation contact material layer is completed.

3. The method according to claim 2, wherein the material of the passivation contact material layer in the pre-formed tunnel passivation structure is selected from one or more of doped amorphous silicon, doped polysilicon, and silicon carbide.

4. The method according to claim 2, wherein the second electrode is configured to be in electrical contact with the passivation contact material layer.

5. The method according to claim 1, wherein the temperature of the same environment is 300-970° C., and the treatment time at 800-970° C. is less than 3 hours.

6. The method according to claim 1, wherein the junction depth of the first emitter layer is less than the junction depth of the second emitter region.

7. The method according to claim 6, wherein the junction depth of the first emitter layer is less than or equal to 0.7 μm, and the junction depth of the second emitter region is greater than or equal to 0.8 μm.

8. The method according to claim 1, wherein the highest boron doping concentration of the first emitter layer is greater than that of the second emitter region, and the total boron doping amount of the first emitter layer is less than that of the second emitter region.

9. The method according to claim 1, wherein the highest point in the ECV doping curve of the first emitter layer is at an internal position at a depth of 0.05-0.5 μm from the surface of the first emitter layer.

10. The method according to claim 1, wherein within the range of a depth of 0.02-0.6 μm from the surface of the first emitter layer in the ECV doping curve of the first emitter layer, the difference between the highest boron doping concentration and the lowest boron doping concentration in the first emitter layer is greater than 1 orders of magnitude.

11. The method according to claim 1, wherein within the range of 0.05-0.7 μm from the surface of the second emitter region in the ECV doping curve of the second emitter region, the difference between the highest boron doping concentration and the lowest boron doping concentration in the second emitter region is less than 1 orders of magnitude.

12. The method according to claim 1, wherein the sheet resistance of the first emitter layer is greater than or equal to 150 ohm/sq, and the sheet resistance of the second emitter region is less than or equal to 150 ohm/sq.

13. The method according to claim 1, wherein the width of the first electrode is smaller than the width of the second emitter region.

14. The method according to claim 1, wherein the material of the passivation and anti-reflection film is selected from one or more of aluminum oxide, silicon oxide, silicon nitride, and silicon oxynitride.

* * * * *